United States Patent
Wengenroth

(10) Patent No.: US 6,524,644 B1
(45) Date of Patent: Feb. 25, 2003

(54) PROCESS FOR SELECTIVE DEPOSITION OF OSP COATING ON COPPER, EXCLUDING DEPOSITION ON GOLD

(75) Inventor: Karl F. Wengenroth, Stratford, CT (US)

(73) Assignee: Enthone Inc., West Haven, CT (US)

( * ) Notice: Subject to any disclaimer, the term of this patent is extended or adjusted under 35 U.S.C. 154(b) by 0 days.

(21) Appl. No.: 09/383,718

(22) Filed: Aug. 26, 1999

(51) Int. Cl.⁷ .............................. B05D 5/12; C23C 22/48
(52) U.S. Cl. ...................... 427/96; 427/327; 148/269; 148/274; 148/282
(58) Field of Search ............................ 106/14.15, 14.16, 106/18.32, 287.21; 148/22, 23, 268, 269, 274, 282; 427/96, 299, 327

(56) References Cited

U.S. PATENT DOCUMENTS

| | | | |
|---|---|---|---|
| 4,395,294 A | * 7/1983 | Hobbins et al. | 148/6.14 R |
| 4,731,128 A | * 3/1988 | Casullo | 428/470 |
| 5,173,130 A | 12/1992 | Kinoshita et al. | |
| 5,348,590 A | * 9/1994 | Shigemura et al. | 148/23 |
| 5,362,334 A | * 11/1994 | Adams et al. | 148/268 |
| 5,376,189 A | 12/1994 | Kukanskis | |
| 5,435,860 A | * 7/1995 | Maki et al. | 148/269 |
| 5,439,783 A | 8/1995 | Akiyama et al. | |
| 5,478,607 A | 12/1995 | Gunji et al. | |
| 5,498,301 A | 3/1996 | Hirao et al. | |
| 5,560,785 A | 10/1996 | Hirao et al. | |
| 5,658,611 A | 8/1997 | Ishido et al. | |
| 5,795,409 A | * 8/1998 | Hirao et al. | 148/269 |

FOREIGN PATENT DOCUMENTS

| | | |
|---|---|---|
| EP | 0 551 112 A1 | 7/1993 |
| EP | 0 643 154 A2 | 3/1995 |
| EP | 0 791 671 A1 | 8/1997 |

OTHER PUBLICATIONS

PWB Assembly, Entek Plus Process, PWB Copper Protective Coating, 1995, Enthone–OMI Inc.

* cited by examiner

Primary Examiner—Brian K. Talbot
(74) Attorney, Agent, or Firm—Senniger, Powers, Leavitt & Roedel

(57) ABSTRACT

A method is provided for the selective deposition of an organic solderability preservative (OSP) coating on copper surfaces of articles such as electronic components, e.g., printed wiring boards, to serve as a protective coating and preserve the solderability of the copper surface while substantially excluding gold surfaces from attracting the same OSP coating which coating causes cosmetic defects in the form of staining and may reduce the conductivity of the gold contact surface. The method improves the conventional OSP process and utilizes a pre-treatment of the copper surface before applying the OSP coating comprising treating the cleaned and preferably micro-etched copper with an aqueous solution of benzimidazole or derivative thereof to form a precoat on the copper surface. After the pre-treatment step, the precoated copper surface is conventionally treated with a suitable OSP solution such as an aqueous solution of a substituted benzimidazole compound, preferably at the 2-position.

15 Claims, No Drawings

PROCESS FOR SELECTIVE DEPOSITION OF OSP COATING ON COPPER, EXCLUDING DEPOSITION ON GOLD

BACKGROUND OF THE INVENTION

1. Field of the Invention

This invention relates to a method for the treatment of metallic surfaces for the protection of the surface from oxidation and for enhancing its solderability and, more particularly, to treating electronic components such as printed wiring boards (PWB's) containing both copper and gold circuitry to provide a protective coating on the copper before the copper is soldered with the gold features on the substrate not being discolored or otherwise electrically affected by the treatment.

2. Description of Related Art

In the manufacture of metal containing components which are to be soldered, it is necessary to protect the metal from oxidation to enhance its solderability. For convenience the following description will be directed to the manufacture of printed wiring boards (PWB's) or other electronic components having copper circuitry which is to be soldered and where it is essential that the copper not be oxidized or otherwise corroded prior to soldering.

Typically, many such electronic components having copper circuitry thereon also have gold leads or other electrical connections which are generally used to connect the electronic component to another electronic component. Currently however, processes used to protect the copper circuitry prior to soldering deleteriously affect the gold metallurgy on the substrate by staining the gold or otherwise electrically affecting the gold.

The processes used today for protecting copper prior to soldering employ a protective coating deposited on the copper. This coating is used as an alternative to hot air solder leveling (HASL) and other metallic printed circuit board surface finishes. The coating provides protection against copper solderability degradation caused by various process steps in the fabrication process such as exposure to multiple heat cycles during electronic component fabrication for surface mount technology (SMT) and mixed technology PWB assembly.

Generally, copper protective coating systems utilize a number of steps including cleaning, microetching and acid rinsing followed by the formation of a protective coating on the copper using a solution containing a protective forming agent. The protective forming agent is typically an imidazole or benzimidazole derivative and the coating is generally termed an organic solderability preservative (OSP) coating.

A number of patents have issued in this area which have attempted to solve the problems associated with providing a protective coating on copper circuitry.

U.S. Pat. No. 5,658,611 to Ishiko et al. provides an aqueous surface protection composition for PWB's containing a benzimidazole derivative and adjusted to a pH of 1–5 with a salt forming acid of a heavy metal such as copper, manganese and zinc in an amount not higher than 50 ppm.

In U.S. Pat. No. 5,173,130 to Kinoshita et al. a process is disclosed for the surface treatment of copper which comprises immersing the surface of the copper in an aqueous solution containing a benzimidazole compound having an alkyl group of at least three carbon atoms at the 2-position and an organic acid. Similarly, in U.S. Pat. Nos. 5,498,301 and 5,560,785 to Hirao et al. a water-based surface treatment agent used to protect copper on a printed wiring board with excellent heat-resistance and moisture-resistance utilizes as an active ingredient a 2-arylimidazole compound.

In EPA Publication No. EP 0 791 671 to Hirao et al. a surface treating agent for copper is disclosed comprising an aqueous solution containing an imidazole compound or a benzimidazole compound, a complexer and iron ions. It is contended that the surface treating agent forms a chemical film selectively on the surface of copper while forming no film on other metals.

In U.S. Pat. No. 5,362,334 to Adams et al. a composition and process for the surface treatment of metallic surfaces such as copper circuitry on printed circuit boards is disclosed which comprises treating the surface with an aqueous solution comprising a benzimidazole compound having either a halogenated phenyl group, a halogenated benzyl group or a halogenated ethyl phenyl group in the 2-position. In U.S. Pat. No. 5,376,189 to Kukanskis a composition and process are disclosed for the treatment of metallic surfaces such as copper on printed circuit boards which comprises treating the surface with an aqueous solution comprising a benzimidazole compound which has at least one carboxylic or sulfonic acid group directly or indirectly attached to the benzimidazole compound.

Unfortunately, current processes for producing a protective coating on the copper surface still, in varying degrees, deleteriously affect the gold metallurgy on the electronic substrate because it attracts the coating used to coat the copper and causes cosmetic defects in the form of staining and may reduce the conductivity of the gold contact surface.

Bearing in mind the problems and deficiencies of the prior art, it is therefore an object of the present invention to provide an improved method to selectively deposit an organic solderability preservative (OSP) coating on copper surfaces of electronic components such as printed wiring boards to serve as a protective coating to preserve the solderability of the copper surfaces while substantially excluding gold surfaces from attracting the same protective coating and staining the gold and/or affecting the conductivity of the gold.

It is another object of the present invention to provide electronic components such as printed wiring boards made using the method of the invention.

Other advantages of the invention would be readily apparent from the following description.

SUMMARY OF THE INVENTION

In one aspect of the invention the method for the treatment of metallic surfaces to protect the surface from oxidation and for enhancing its solderability and, in particular, to treating electronic components such as printed wiring boards containing both copper and gold circuitry to provide a protective coating on the copper before the copper is soldered with the gold features on the substrate not being discolored or otherwise electrically affected by the treatment has been improved. In the method for the treatment of metallic surfaces for protection of the surface from oxidation for enhancing its solderability the metallic surface is cleaned, optionally etched and then contacted with a solution of an organic solderability preservative material typically a triazole, imidazole or benzimidazole or derivatives thereof whereby an organic solderability preservative protective film or coating is formed on the metallic surface, the improvement comprising:

contacting the metallic surface with a pre-treatment solution prior to contact of the metallic surface with an organic solderability preservative material typically a solution of triazole, imidazole or benzimidazole or derivatives thereof used to provide the organic solderability protective coating, the pre-treatment solution comprising a benzimidazole compound having the formula:

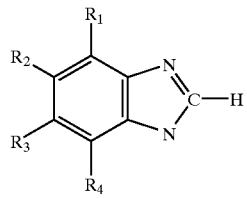

wherein $R_1$, $R_2$, $R_3$, and $R_4$ are independently selected from the group consisting of hydrogen atoms, substituted or unsubstituted alkyl groups of 1–10 carbon atoms, preferably a lower alkyl of 1–4 carbon atoms, substituted or unsubstituted aryl groups, halogen atoms, alkoxy groups of 1 to 10 carbon atoms, preferably 1 to 4 carbon atoms, alkyl amino groups of 1 to 10 carbon atoms, preferably 1–4 carbon atoms, cyano groups, nitro groups and mixtures thereof.

In a preferred aspect of the invention $R_1$, $R_2$, $R_3$, and $R_4$ are all hydrogen.

The benzimidazole compound used to form the pre-treatment solution is dissolved to form a solution, preferably aqueous, and preferably includes a corrosion inhibitor compound such as an alkanolamine, e.g., a C1–C4 alkanolamine such as triisopropanolamine, and a buffering agent such as a salt like ammonium acetate to stabilize the pH. The solution may be used over a wide range of temperatures typically 70° F. to the boiling point of the solution, typically 70° F. to 120° F., preferably 70° F. to 90° F. The pH of the solution may also range widely from about 1 to 11, and is preferably about 7–10, e.g., 8–9.

In another aspect of the invention, electronic components made using the method of the invention are provided.

DESCRIPTION OF THE PREFERRED EMBODIMENT(S)

The present invention for convenience is specifically described for a protective coating system for copper metallurgy on printed wiring boards (PWB's) including copper pads and through holes. The protective coating is used as an alternate to hot air solder leveling (HASL) and other metallic PWB surface finishes. The coating of the invention provides excellent protection against copper solderability degradation caused by exposure to multiple heat cycles during SMT and mixed technology PWB assembly.

The above referenced patents are directed to the surface protection of copper metallurgy on PWBs and disclose the basic OSP process for treating the PWB. In general, the surface of the copper or copper alloy is first cleaned by immersion of the board in a cleaner and then preferably etched to increase the adhesion of the copper. The copper is then immersed in a solution containing an organic solderability preservative material such as triazole, imidazole, benzimidazole or derivatives thereof. Spraying or other forms of coating may also be used.

Cleaning of the PWB may be performed using any number of cleaners including alkaline, acid or neutral cleaners and is preferably an acidic cleaner like sulfuric acid, HCl and citric acid. The PWB is typically contacted with the cleaner for up to about 5 minutes at a temperature of 80° to 120° F.

All the steps in the conventional OSP process are followed by rinsing the substrate typically with deionized water. Rinsing is usually performed at an ambient temperature, e.g., 75° F.

An etchant is preferably used to microetch the surface of the copper to increase the adhesion of the copper and an etchant such as a persulfate salt such as sodium persulfate or sulfuric peroxide type material at 70°–100° F. for up to about 1 min. is typically employed.

It is also preferable, but optional, to use a dilute sulfuric acid solution such as a 5% by weight sulfuric acid solution for up to about 2 minutes at 70° to 90° F. to prevent drag-down contamination of the OSP solution by the etchant solution.

Following the conventional procedure, the substrate is now ready to be treated with the OSP solution to form the protective layer on the copper metallurgy. This is usually performed at a temperature of 95° to 115° F., preferably about 105° to 110° F. for about 15 seconds to 1 minute.

After the OSP treatment, the substrate is rinsed and typically dried by dry forced air. The substrate is now ready to be soldered and will be protected against oxidation until the soldering step is performed.

As can be seen from the above cited patents, a number of OSP solutions have been developed which may be used to form the OSP coating. The present invention treats the PWB before the OSP treatment to precoat the copper and any suitable OSP solutions in the prior art may be used to provide the final coating on the substrate metallurgy.

For example, U.S. Pat. No. 5,362,334, supra, OSP solutions containing the following compound may be employed:

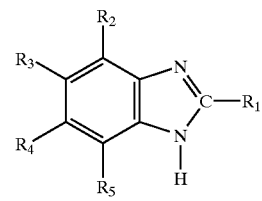

wherein at least 1 of the constituents, $R_1$, $R_2$, $R_3$, $R_4$, and $R_5$ must be selected from the group consisting of halogens, substituted or unsubstituted halogenated alkyl groups and substituted or unsubstituted halogenated aryl groups; and wherein the remaining constituents, $R_1$, $R_2$, $R_3$, $R_4$, and $R_5$, are selected from the group of consisting of hydrogen, nitro groups, substituted or unsubstituted alkyl groups and substituted or unsubstituted aryl groups.

In U.S. Pat. No. 5,376,189 compounds represented by the following general formula are used in the OSP solution:

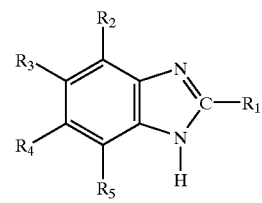

wherein at least 1 of the constituents $R_1$, $R_2$, $R_3$, $R_4$, and $R_5$, must be selected from the group consisting of carboxylic acid groups, sulfonic acid groups, alkyl groups substituted with carboxylic or sulfonic acid groups and aryl groups substituted with carboxylic or sulfonic acid groups.

In U.S. Pat. No. 5,658,611, a benzimidazole derivative which is used in OSP solutions contains an effective component represented by the general formula of:

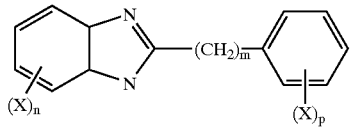

wherein X is a radical, with the number of carbon atoms from 1 to 7, of the group consisting of alkyl group, halogen atoms amino group, lower dialkylamino grup, lower alkoxyl group, cyano group, acetyl group, benzoyl group, carbamoyl group, formyl group, carboxyl group, lower alkoxylcarbonyl group and nitro group, n and p are integers of 0 to 4, and m is an integer of 1 to 10.

The solution is adjusted to pH range from 1 to 5 with a salt-forming acid and the aqueous solution has a metal content of a heavy metal selected from the group consisting of copper, manganese and zinc and which metal is not higher than 50 ppm.

In U.S. Pat. Nos. 5,498,301 and 5,560,785 a water based surface treatment agent contains as an active ingredient a 2-arylimidazole component represented by the following formula:

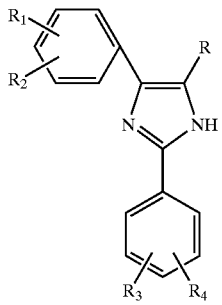

wherein R is a hydrogen atom or a methyl group, $R_1$ and $R_2$ are hydrogen atoms, lower alkyl groups or halogen atoms, and $R_3$ and $R_4$ are hydrogen atoms, lower alkyl groups, halogen atoms, lower alkoxyl groups, di-lower alkylamino groups, cyano groups or nitro groups.

In U.S. Pat. No. 5,173,130 OSP solutions contain compounds represented by the following general formula are used:

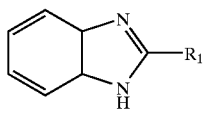

wherein $R_1$ represents an alkyl group having at least 3 carbon atoms.

Furthermore, compounds represented by the following general formula can also be used for carrying out the process:

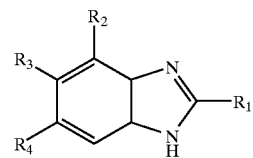

wherein $R_1$ represents an alkyl group having at least 3 carbon atoms, and $R_2$, $R_3$, and $R_4$ represent a lower alkyl group, a halogen atom, a nitro group or a hydrogen atom, with the proviso that at least one of $R_2$, $R_3$, and $R_4$ represents a lower alkyl group, a halogen atom or a nitro group.

In EP 0 551 112 a benzimidazole derivative used in OSP solutions is represented by the following formula:

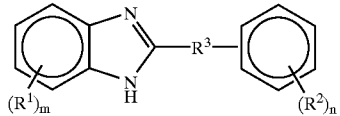

wherein $R^1$ is a hydrogen atom, a lower alkyl group, or a halogen atom; $R^2$ is a hydrogen atom or a lower alkyl group; $R^3$ is an alkylene group with 1 to 18 carbon atoms; and n and m are integers from 0 to 3.

In EP 0 791 671 an OSP solution containing an imidazole compound or a benzimidazole compound is shown which includes a complexor and iron ions.

In the present invention, the above OSP process is improved by using a pre-treatment step wherein the substrate is contacted with a pre-treatment solution before the OSP treatment, the pre-treatment solution comprising a benzimidazole compound having the formula:

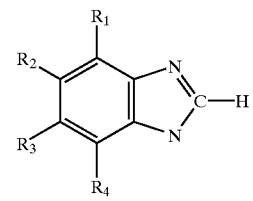

wherein $R_1$, $R_2$, $R_3$, and $R_4$ are independently selected from the group consisting of hydrogen atoms, substituted or unsubstituted alkyl groups of 1–10 carbon atoms, preferably a lower alkyl of 1–4 carbon atoms, substituted or unsubstituted aryl groups, halogen atoms, alkoxy groups of 1 to 10 carbon atoms, preferably 1 to 4 carbon atoms, alkyl amino groups of 1 to 10 carbon atoms, preferably 1–4 atoms, cyano groups, nitro groups and mixtures thereof.

Using the process of the invention it has been found that the pre-treatment step enhances the final protective coating on the copper metallurgy with other metallurgy such as gold on the substrate being substantially unaffected by the OSP treatment process used to protect the copper surface.

The pre-treatment solution is preferably an aqueous solution having a pH of about 1 to 11, preferably 7 to 10 and most preferably 8–9 and is used at a temperature of about 70° to 120° F. or higher, preferably 70° to 90° F. The benzimidazole active ingredient in the solution is typically used at a range of about 0.1 to 10 g/l, preferably 0.5 to 2 g/l, e.g., 1 g/l. The contact time may also vary widely from about 5 seconds to 10 minutes, preferably 15 seconds to 1 minute, typically 15 sec. for a conveyor system and 1 minute for a dip tank process.

Solubilizers and buffering agents are typically used to dissolve the benzimidazole active ingredient in the solution and maintain the solution pH, respectively. An alcohol such as isopropanol may be used to solubilize the active ingredient wherein the active ingredient is dissolved in the alcohol and then added to the water used to make the pretreating solution. If isopropyl alcohol is used, it has been found that the alcohol is typically vaporized from the working solution used to pretreat the substrate. Heat may also be used to solubilize the active ingredient. Corrosion inhibitors such as triisopropanolamine, and other alkanolamines (e.g. C1–C4 alkanolamine) and other such materials are preferably used in the composition in an amount of about 0.05 to 5 g/l, preferably 0.5 to 1 g/l, e.g., 0.7 g/l. Salts, preferably ammonium salts such as ammonium acetate, ammonium formate and the like may be used as a buffering agent to maintain the solution pH in an amount of about 0.1 to 5 g/l, preferably 0.25 to 0.6 g/l, e.g., 0.4 g/l.

It will be understood by those skilled in the art, that higher contact temperatures will usually decrease the amount of the time needed to provide the desired pre-treatment efect. Similarly, increased concentration will typically decrease the amount of time needed to provide the desired pre-treatment effect.

Various embodiments of the present invention will now be illustrated by reference to the following specific examples. It is to be understood, however, that such examples are presented for purposes of illustration only, and the present invention is in no way to be deemed as limited thereby.

With regard to the examples, the samples tested were treated using both a conveyor where the noted solutions are sprayed onto the sample surface and a dip tank where the samples are dipped (immersed) in the noted solutions. Similar results were obtained using each type process.

EXAMPLE 1

Samples of PWBs with both copper and gold plated pad features as well as thickness test coupons of copper and gold were processed through the following sequence:

| Solution | Conveyor | Dip Tank | Temp. |
| --- | --- | --- | --- |
| 1. Cleaner | 15 sec. | 2 min. | 100° F. |
| 2. Rinse | 15 sec. | 1 min. | 75° F. |
| 3. Etch | 15 sec. | 1 min. | 80° F. |
| 4. Rinse | 15 sec. | 1 min. | 75° F. |
| 5. Precoat[a] | 15 sec. | 1 min. | 75° F. |
| 6. Rinse | 15 sec. | 1 min. | 75° F. |
| 7. OSP solution[b] | 1 min. | 1 min. | 85–110° F. |
| 8. Rinse | 15 sec. | 1 min. | 120° F. |
| 9. Dry, forced air | 15 sec. | 1 min. | 120° F. |

[a]Composition of Precoat working solution: benzimidazote, 1 g/l; triisopropanolamine, 0.7 g/l; ammonium acetate, 0.39 g/l; in aqueous solution. Isopropanol was used to solubilize the benzimidazole and was essentially volatilized from the working sotution.
[b]A commercial OSP solution containing a 2-position substituted benzimidazole compound with less than 25 ppm copper as metal included in the solution.

Observation of gold features indicated bright, unstained gold, substantially free of deposition of OSP coating. Deposit thickness on gold and copper were determined from the thickness test coupons, confirming 0.3–0.4 micron OSP deposit on copper and 0.0–0.01 micron OSP deposit on gold.

Further investigation of the coating's ability to offer robust protection of copper pads as a solderability preservative was carried out by simulated reflow and subsequent wave soldering of the coated PWB samples after accelerated aging at 40° C. and 90% relative humidity for 10 days vs. control samples as described in Comparative Example 1. Hole fill with solder results indicated protection equal to better than the control, which has been well defined as the industry standard for OSP performance, with 98–100% holes completely filled after wave soldering.

Comparative Example 1

Samples of PWBs with both copper and gold plated pad features as well as thickness test coupons of copper and gold were processed through the following sequence:

| Solution | Conveyor | Dip Tank | Temp. |
| --- | --- | --- | --- |
| 1. Cleaner | 15 sec. | 2 min. | 100° F. |
| 2. Rinse | 15 sec. | 1 min. | 75° F. |
| 3. Etch | 15 sec. | 1 min. | 80° F. |
| 4. Rinse | 15 sec. | 1 min. | 75° F. |
| 5. 5% sulfuric acid | 15 sec. | 1 min. | 75° F. |
| 6. Rinse | 15 sec. | 1 min. | 75° F. |
| 7. OSP solution[c] | 1 min. | 1 min. | 110° F. |
| 8. Rinse | 15 sec. | 1 min. | 75° F. |
| 9. Dry, forced air | 15 sec. | 1 min. | 120° F. |

[c]same as OSP solution of Example 1 except with over 25 ppm copper as metal included in the solution.

Observation of gold features indicated stained and discolored gold from deposition of OSP coating. Deposit thickness on gold and copper were determined from the thickness test coupons, confirming 0.3–0.4 micron OSP deposit on copper and 0.1–0.2 micron OSP deposit on gold.

Further investigation of the coating's ability to offer robust protection of copper pads as a solderability preservative was carried out by simulated reflow and subsequent wave soldering of the coated PWB samples after accelerated aging at 40° C. and 90% relative humidity for 10 days. Hole fill with solder results indicated excellent solderability, with 98–100% holes completely filled after wave soldering.

Comparative Example 2

Samples of PWBs with both copper and gold plated pad features as well as thickness test coupons of copper and gold were processed through the following sequence:

| Solution | Conveyor | Dip Tank | Temp. |
| --- | --- | --- | --- |
| 1. Cleaner | 15 sec. | 2 min. | 100° F. |
| 2. Rinse | 15 sec. | 1 min. | 75° F. |
| 3. Etch | 15 sec. | 1 min. | 80° F. |
| 4. Rinse | 15 sec. | 1 min. | 75° F. |
| 5. 5% sulfuric acid | 15 sec. | 1 min. | 75° F. |
| 6. Rinse | 15 sec. | 1 min. | 75° F. |
| 7. OSP solution[d] | 1 min. | 1 min. | 110° F. |
| 8. Rinse | 15 sec. | 1 min. | 75° F. |
| 9. Dry, forced air | 15 sec. | 1 min. | 120° F. |

[d]Same as OSP sotution of Example 1

Observation of gold features indicates bright, unstained gold, free of deposition of OSP coating. Deposit thickness on gold and copper were determined from the thickness test coupons, confirming 0.08–0.1 micron OSP deposit on copper and 0.0–0.01 micron OSP deposit on gold. Although negligible deposition was observed on the gold as was desired, the results on copper were unacceptably low in thickness and non-uniform in appearance.

Further investigation of the coating's ability to offer robust protection of copper pads as a solderability preservative was carried out by simulated reflow and subsequent wave soldering of the coated PWB samples after accelerated aging at 40° C. and 90% relative humidity for 10 days vs. control samples as described in Comparative Example 1. Hole fill with solder results indicated lesser protection than the control, which has been well defined as the industry standard for OSP performance, with only 58–75% of holes completely filled after wave soldering vs. 98–100% holes completely filled for the control sample. Thus, the invention claimed in the prior art is deemed inadequate to provide a reliable process that can consistently produce a suitable OSP coating that provides sufficient protection of copper pads, which is the primary function of OSP coatings.

EXAMPLE 2

The method of Example 1 is repeated using a series of OSP solutions based on derivatives disclosed in U.S. Pat. Nos. 5,173,130; 5,362,334; 5,376,189; 5,498,301; 5,560,789; 5,658,611 and EP 0 551 112 and EP 0 791 671. Similar solderability protection results are obtained.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for imparting corrosion protection by means of an organic solderability preservative solution to an electronic component in preparation for soldering, which component has copper circuitry and gold circuitry, the method comprising the following steps in sequence:
    a) contacting the component with a pre-treatment solution which imparts the copper circuitry over the gold circuitry with selectivity for the organic solderability preservative, the pretreatment solution comprising a benzamidazole compound having the formula:

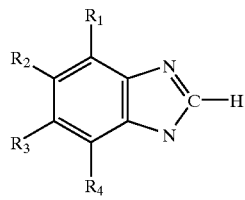

wherein R1, R2, R3 and R4 are independently selected from the group consisting of hydrogen atoms, substituted or unsubstituted alkyl groups of 1–10 carbon atoms, substituted or unsubstituted aryl groups, halogen atoms, alkoxy groups of 1 to 10 carbon atoms, alkyl amino groups of 1 to 10 carbon atoms, cyano groups, nitro groups, and mixtures thereof;

b) contacting the component with the organic solderability preservative solution to selectively deposit organic solderability preservative on the copper circuitry while substantially excluding deposition of organic solderability preservative on the gold circuitry, thereby avoiding staining of the gold circuitry and deterioration of conductivity of the gold circuitry by the organic solderability preservative.

2. The method of claim 1 wherein $R_1$, $R_2$, $R_3$, and $R_4$ are all hydrogen.

3. The method of claim 1 wherein the pre-treatment solution further contains a corrosion inhibitor.

4. The method of claim 3 wherein the corrosion inhibitor is a C1–C4 alkanolamine.

5. The method of claim 4 wherein the alkanolamine is triisopropanolamine.

6. The method of claim 3 wherein the pre-treatment solution further contains a buffering agent to stabilize the pH of the solution.

7. The method of claim 6 wherein the buffering agent is an ammonium salt.

8. The method of claim 7 wherein the ammonium salt is ammonium acetate.

9. The method of claim 1 wherein the pre-treatment solution is used at a temperature of about 70° F.–120° F.

10. The method of claim 9 wherein the pH of the pre-treatment solution is about 1–11.

11. The method of claim 10 wherein the pH of the pre-treatment solution is about 7–10.

12. The method of claim 10 wherein the organic solderability preservative is a solution of triazole, imidazole or benzimidazole or derivatives thereof.

13. The method of claim 12 wherein the organic solderability preservative is a 2-substituted benzimidazole compound.

14. The method of claim 13 wherein the organic solderability preservative solution of triazole, imidazole or benzimidizole or derivatives thereof contains a heavy metal in an amount less than about 50 ppm of a heavy metal.

15. The method of claim 14 wherein the heavy metal is copper.

* * * * *